(12) United States Patent
Forstner et al.

(10) Patent No.: US 7,922,925 B2
(45) Date of Patent: Apr. 12, 2011

(54) METHOD AND DEVICE FOR REMOVING LAYERS IN SOME AREAS OF GLASS PLATES

(75) Inventors: Helmut Forstner, Hausmening (AT); Alfred Hofrichter, Aachen (DE)

(73) Assignee: Saint-Gobain Glass France, Courbevoie (FR)

( * ) Notice: Subject to any disclaimer, the term of this patent is extended or adjusted under 35 U.S.C. 154(b) by 644 days.

(21) Appl. No.: 10/561,008

(22) PCT Filed: Jun. 16, 2004

(86) PCT No.: PCT/EP2004/006478
§ 371 (c)(1),
(2), (4) Date: Dec. 16, 2005

(87) PCT Pub. No.: WO2004/114357
PCT Pub. Date: Dec. 29, 2004

(65) Prior Publication Data
US 2007/0090092 A1 Apr. 26, 2007

(30) Foreign Application Priority Data
Jun. 16, 2003 (AT) ................................. A 933/2003

(51) Int. Cl.
*H01L 21/302* (2006.01)
(52) U.S. Cl. ................ 216/67; 216/59; 438/5; 438/710; 219/121.41
(58) Field of Classification Search .......................... None
See application file for complete search history.

(56) References Cited

U.S. PATENT DOCUMENTS

| 5,319,186 | A | * | 6/1994 | Lenhardt ........................ 250/202 |
| 5,811,021 | A | | 9/1998 | Zarowin et al. |
| 5,837,958 | A | * | 11/1998 | Fornsel ....................... 219/121.5 |
| 6,103,315 | A | * | 8/2000 | Gray et al. ..................... 427/454 |
| 6,238,582 | B1 | | 5/2001 | Williams et al. |
| 6,238,587 | B1 | * | 5/2001 | Siniaguine et al. ............. 216/59 |
| 6,262,386 | B1 | * | 7/2001 | Fornsel ..................... 219/121.52 |
| 6,620,333 | B2 | * | 9/2003 | Brusasco et al. ................. 216/24 |
| 6,659,110 | B2 | * | 12/2003 | Fornsel et al. .................. 134/1.1 |
| 7,179,397 | B2 | * | 2/2007 | Siniaguine ...................... 216/67 |
| 7,332,056 | B2 | * | 2/2008 | Kobayashi et al. ....... 156/345.17 |
| 2001/0046790 | A1 | | 11/2001 | Matsukuma |
| 2002/0008082 | A1 | * | 1/2002 | Tanaka et al. .................... 216/67 |
| 2002/0100751 | A1 | | 8/2002 | Carr |
| 2003/0106788 | A1 | * | 6/2003 | Babko-Malyi ................ 204/164 |
| 2004/0238124 | A1 | * | 12/2004 | Nakamura ............... 156/345.43 |
| 2008/0099441 | A1 | * | 5/2008 | Carr ................................. 216/67 |

FOREIGN PATENT DOCUMENTS

| EP | 0 709 348 | 5/1996 |
| GB | 803 371 | 10/1958 |

* cited by examiner

*Primary Examiner* — Anita K Alanko
(74) *Attorney, Agent, or Firm* — Oblon, Spivak, McClelland, Maier & Neustadt, L.L.P.

(57) ABSTRACT

Substrates with a coating, in particular a metal-containing coating, are freed of coating in some regions, in particular in the edge region, with the aid of plasma directed onto the coated side of the substrate. The width of the region in which the coating is removed may be set such that plasma from a number of plasma heads arranged next to one another in a row or from one plasma head with variable cross section is directed onto the substrate in the desired width from which the coating is to be removed, wherein the plasma head or heads is/are suitably aligned with respect to the substrate and/or the required number of plasma heads in each case are set in operation. It is also possible to remove coatings only partially in terms of the layer thickness.

9 Claims, 3 Drawing Sheets

METHOD AND DEVICE FOR REMOVING LAYERS IN SOME AREAS OF GLASS PLATES

CROSS-REFERENCE TO RELATED APPLICATIONS

Figure 1:
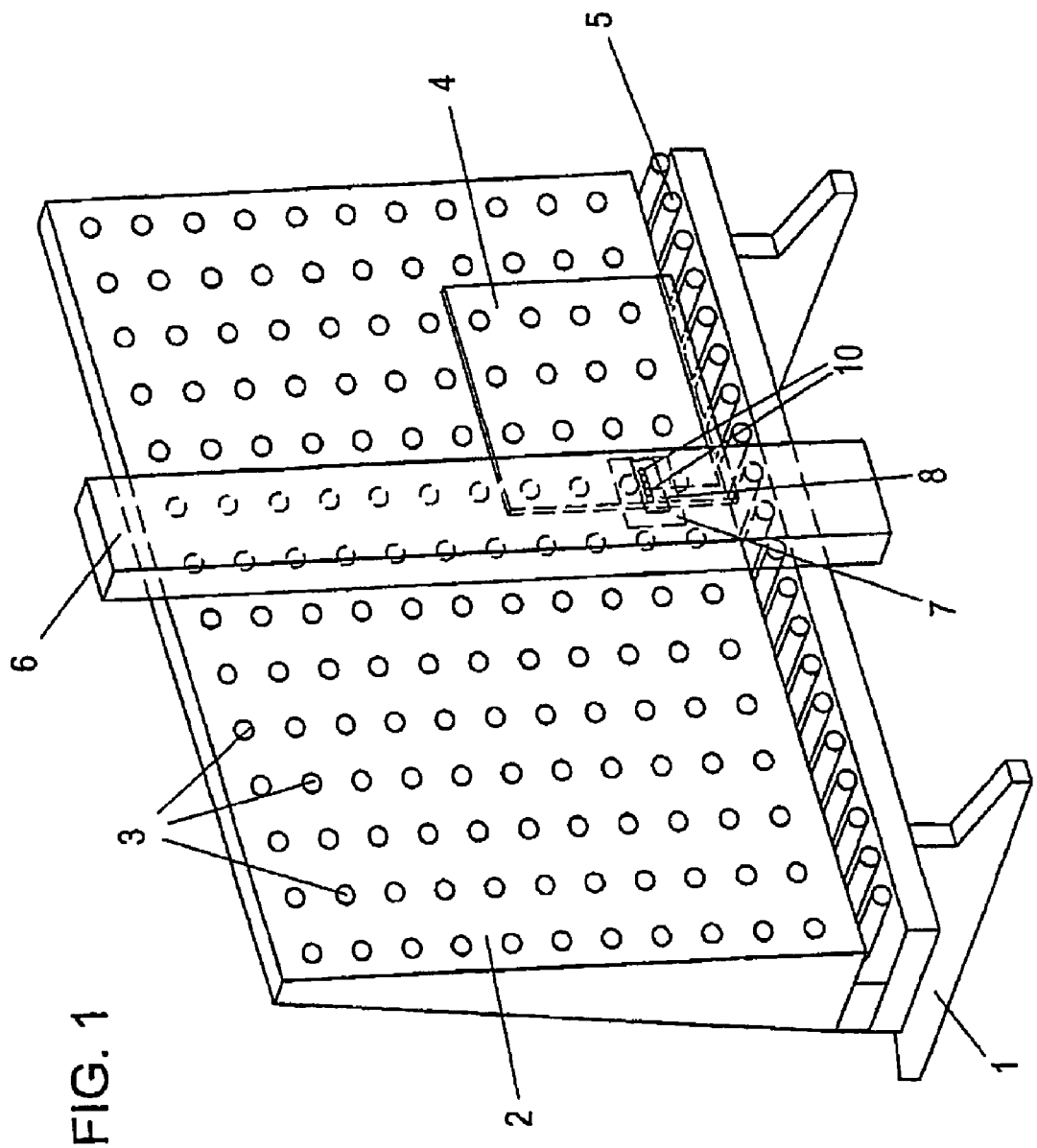

The present application is the U.S. counterpart of WO 2004/114357, and in turn claims priority to Austrian Application No. A 933/2003 filed on Jun. 16, 2003, the entire contents of each of which are hereby incorporated herein by reference.

The invention relates to a process for removing a coating from coated substrates.

For many applications, transparent substrates, in particular plates made of glass or plastic but also films for example made of PET (polyethylene terephthalate), are provided with coatings before being brought into their final processing state. For example, in order to manufacture insulating glass (at least two individual plates joined to one another by means of a spacer frame), use is made of plates which have a coating, in particular a metal-containing coating, in order to reduce their permeability, in particular to heat rays, that is to say in the infrared range, and in order to influence the passage of light as a whole in the desired manner. The same heat-reflecting purpose can also be achieved in composite plates, in which case the coated surface lies within the composite.

The term coating is understood here to mean not only a simple, single-layer coating but in particular also layer systems which consist of a number of individual layers, be they metal layers, oxide layers, nitride layers, organic layers or mixtures thereof.

Anti-reflection or reflection-reducing layers are also often applied to such transparent substrates, with heat-reflecting layer systems usually comprising such anti-reflection layers in any case. Other applications or functions require, for example, hydrophobic or hydrophilic coatings on the substrate surfaces which are exposed to weather conditions.

Besides purely passive use purposes such as the aforementioned heat insulation or infrared reflection, electrically conductive (metal-containing) coatings may also be used actively as panel heating systems or as antenna arrays. Water-repelling and/or self-cleaning properties of such coatings are likewise known, as are electrochromic, thermochromic, etc. coatings. Such coated (window) panes or plates are used in the construction industry and in all types of motor vehicle and aircraft.

It is advantageous to coat the substrates, e.g. float glass, over large surface areas in suitably large systems (this is usually carried out by sputtering or CVD), and to subsequently cut and further process the required smaller substrates.

For various reasons, an initially large-surface-area coating sometimes has to be partially/locally removed for the final use purpose of the respective substrate, and this may take place before or after the cutting operation.

If, for example, coated glass plates are used for insulating glass, these are arranged such that their coated side faces the interior of the insulating glass, that is to say the air gap, in order that the mechanically sensitive coating is as well protected as possible. One problem with insulating glass comprising at least one coated glass plate is that the customary compounds for joining the edges (butyl rubber and polysulphide as sealing compound) adhere poorly to the metal-containing coating and thus the strength of the edge join and the diffusion-tightness are not ensured to the desired extent. In the case of composite plates, the reduced adhesion is not very problematic on account of the large-area gluing of the rigid plates.

A similar adhesion problem may arise in the case of other, in particular hydrophobic or hydrophilic or anti-reflective, coated substrates or surfaces if accessory parts, such as seals or window lift mechanisms, are to be adhesively fixed to these surfaces.

In general, in such and similar use cases, direct adhesion of the aforementioned and other accessory parts to the uncoated substrate surface is preferred, since the available adhesives are suited to this and in order to as far as possible minimize the number of boundary layers involved.

One problem in particular with metal-containing coatings is also that the metal parts or layers may corrode under environmental influences. This risk of damage occurs in particular in the case of insulating glass which is designed as so-called stepped glass, in which the glass plates are of different size so that at least one of the glass plates of stepped glass protrudes beyond the other glass plate at least at one edge section. A metal-containing coating in the region of the glass plate which protrudes beyond the other glass plate may corrode and thus not only be of unpleasant appearance but also impair the tightness of the edge join of insulating glass.

However, the abovementioned corrosion problem also occurs in the case of coated substrates which for example are installed in cars (windscreens or composite plates in general). Although in this case too the coating is on a surface lying within the composite, without special protective measures corrosion damage which advances from the edge of the substrate to the face thereof occurs in this case too.

For other reasons, too, it may be beneficial to remove the coating from part-areas of a substrate. If, for example, substrates coated with a metal-containing coating are installed as antenna or shield plates in metal frames, it may be necessary to omit the coating around this metal frame or at least partially at a distance therefrom. In the case of the antenna in cars, this for example prevents capacitive coupling of the antenna array with the vehicle bodywork. Furthermore, from time to time deliberate radiation transmission through an area ("communication window") coated with a (metal-containing) coating is required, for example for infrared remote controls, toll cost detection systems, etc.

In the case of hydrophobic coatings, it may be advantageous for example to remove the coating from regions for the use of sensors (rain sensor) or in general from a window (for example in the "rear-view mirror region" of a side window).

Finally, it may also be necessary to remove a coating consisting of a number of layers only partially in the sense that only one or more top layers of a layer system are removed while one or more underlying layers are left on the substrate. This is preferred in particular if one or more remaining (base) layer(s) does not impair further use of the substrate or is even necessary.

In order to eliminate these aforementioned problems and to satisfy the requirements, it is known to remove the coating, in particular in the edge region, with a specific width or on a specific area. For this purpose, apparatuses are known which can be used to remove the coating, at least in the edge region, from (metal-)coated glass plates if they are to be used for insulating glass or other use purposes mentioned above. Such apparatuses operate with thermal devices (gas flames or plasma, cf. DE 34 03 682 C) or with mechanical devices such as grinding or polishing wheels. By way of example, reference may be made to EP 0 517 176 A (=DE 41 18 241 A), DE 43 42 067 A or EP 603 152 A.

One advantage of plasma treatment (at atmospheric pressure) for removing coatings is that there are no significant problems with positioning the plasma treatment device or the plasma head in relation to the substrate surface, whereas in mechanical abrasive apparatuses imprecise positioning of the grinding wheels is a considerable source of error, particularly if the grinding wheels exhibit relatively pronounced wear.

However, one problem when removing coatings from glass or plastic plates, even if this is carried out using plasma, is that the width or area of the region from which the coating is removed cannot readily be changed during the coating removal operation, so that if a wider region from which the coating is to be removed is required, the region from which the coating is to be removed has to be passed over a number of times.

This has a disruptive or slowing effect during the manufacture of stepped insulating glass comprising at least one coated glass plate. If the two glass plates have different dimensions (e.g. "stepped element") and the coated glass plate has the greater surface area, it is necessary to select the region from which the coating is to be removed to be wider in the protruding regions than has to date been possible.

One problem with the known processes and apparatuses for removing coatings is also that, when using just one plasma head, the region from which the coating is to be removed also has to be passed over a number of times if this region is a non-integer multiple, for example one and a half times, the effective width of the plasma head for the coating removal operation.

Such multiple operations are a great hindrance from the production technology standpoint because they may considerably increase the time requirement per substrate and thus reduce the efficiency of the system.

With some systems of the conventional type which are equipped with a single plasma head or one plasma nozzle, the width of the region from which the coating is removed can be changed within a range of +/− 3 mm, for example by changing the radiation intensity of the plasma.

It is an object of the invention to provide a process and an apparatus which make it possible to adjust the width of the region in which an existing coating is removed to the desired size in each case.

This object is achieved in terms of the process by the features of process claim 1.

Advantageous and preferred refinements of the process according to the invention and of the apparatus according to the invention form the subject matter of the dependent claims which in each case follow the independent claims.

The invention involves bringing the area in which the plasma hits the substrate (working region, coverage region or coating removal region) into correspondence as precisely as possible with the area or width on which the coating has to be removed. This does not rule out the possibility of the plasma also going beyond the edge of the substrate, that is to say extending beyond the region from which the coating is to be removed or even if necessary hitting the end edge of the substrate from which the coating is possibly also to be removed.

Since, according to the invention, the width or area of the region in which the coating is removed can be changed in a targeted manner by controlled changing of the effective width or area of the plasma beam directed from a plasma source (head, nozzle, etc.) onto the coated substrate, it is possible to remove the coating during preparation of the substrates for their subsequent uses, as mentioned above, to the desired extent in each case, in particular at the edge, in a quicker and more flexible manner than has hitherto been possible.

It should be noted that the terms "plasma source" or "plasma head" which are repeatedly used below are to be understood as meaning in general all conceivable forms of outlet openings which can direct a plasma or a plasma beam in more or less bundled form in a targeted manner onto a substrate or onto a coated surface. These may have fixed or variable cross sections, wherein it is also possible where necessary to adjust relative to one another multiple heads which are combined to form groups, in order to change the width of the working region and/or the plasma energy per unit of area treated.

The possibility is obtained of selecting different coating removal widths in different regions and/or edge sections of a substrate. In particular, it is possible to change during the treatment the width or area of the region of the substrate in which the latter is to have its coating removed, and thus in the best case to remove the coating from the entire area in one operation to the required extent.

A further advantage of this procedure according to the invention is achieved in that, if required, at the same time as removing the coating from the (main) face of the substrate, the coating can also be removed from the end edge or face thereof if there is also a coating there (overspray, original edge has remained unaffected during the model cutting operation, etc.). If coating removal on the end edge is necessary, it may be expedient according to the invention to then also allow the plasma beams to hit this end edge directly (essentially in the normal direction). For this, it may be useful to guide the plasma heads or nozzles accordingly in a pivotable manner.

It is advantageous in the invention in one embodiment that the width of the region from which the coating is removed can be set independently of the diameter or dimensions of an individual plasma head used to emit or output a plasma beam.

It is also advantageous in the invention that the time taken to remove the coating on the edge or face is shortened even in the case of relatively wide working or coating removal regions, since it is no longer necessary to pass over the coating removal region a number of times in order to achieve the desired width of the region (strip) from which the coating is removed.

If, according to the invention, coating removal is carried out using at least two plasma heads, in one embodiment there is the advantageous possibility of aligning the plasma heads relative to the edge of the glass plate from which the coating is to be removed in some regions, such that one of the plasma heads acts on the coating only partially, e.g. only with a third of its possible effective width. The width of the region from which the coating is to be removed can thus be selected freely and changed during the machining operation by suitably positioning the plasma heads, without having to pass over the edge of the glass plate a number of times.

Of course, it is also possible to operate only some of several plasma heads if the desire is to remove the coating from a narrow strip, and to activate or switch on additional heads or nozzles if the coating is to be removed from a greater width or area.

If, in the apparatus according to the invention, the carrier for the at least two plasma heads can rotate about an axis perpendicular to the plane of the substrate from which the coating is to be removed, with such a device the substrate can be passed over all the way round in order to remove its coating over the entire edge region or over part of its periphery. If there is continuous rotatability of the plasma heads, which are arranged in at least one row, it is also possible to pass over any contours (shaped or model plates), and the orientation of the row of plasma heads will advantageously always be perpendicular to the edge of the glass plate. However, changes to the coating removal width may also be achieved, for example, by targeted deviation of the angle of said row with respect to the substrate edge or to the direction of advance of the coating removal operation.

In general, the desire with the treatment process according to the invention is to achieve as sharp and as clean an edge of the coating as possible in the transition from the coated area to the area from which the coating has been removed. According to one advantageous development of the invention, it is therefore possible to provide a flat shield which prevents uncontrolled spreading of the plasma beam or plasma beams from the respectively operating heads. Using a suitable "travelling" shield which for example surrounds the actual current working area (the current coverage region of plasma and substrate) in the manner of a frame, it is furthermore possible to prevent layer particles that have already been removed from settling in the form of an "overspray" on the surfaces that have still to be machined or on the adjacent surfaces, on the end edge or even (when working along the substrate edge) on the surface lying opposite. Such a flat shield may also minimize re-settling of layer particles that have already been removed on areas that have already had their coating removed.

The shield is advantageously moved and positioned together with the plasma heads, wherein it should not touch the remaining coating despite a spacing that is as small as possible.

In addition, in a manner known per se, a device may also be carried which immediately discharges the detached layer particles (e.g. pneumatic suction). Such suction may optionally be associated with a shield of the aforementioned type.

With a plasma treatment under atmospheric pressure of the type described here, it is possible if necessary to remove only part-layers of a layer system in a much simpler manner than using the mechanical method. If the part-layers are of different type (organic, metal, oxide, nitride, hydrophobic/hydrophilic), the plasma may optionally be generated in a layer-specific or material-specific manner (for example by using etching gases or reactive gases specifically adapted to the material to be removed and/or by controlling the process parameters such as, e.g., gas flow, flow rate), in order to carry out a selective etching or burn-off process.

By controlling the energy or degree of activation of the plasma, it is also possible for example to vary the penetration depth of the plasma and thus the extent to which the coating is removed perpendicular to the substrate surface.

Finally, it may also be desirable or necessary to provide a gradual transition from the coated area to the region from which the coating has been removed. This may be necessary for example for optical reasons but also for functional reasons. By splitting a plasma source into a number of individually controllable beam heads or nozzles, according to the present invention it is also possible to achieve such a differentiated removal of the coating. It is possible for example to configure part of the plasma for complete coating removal and to configure another part for selective coating removal only of top layers of a layer system.

It should furthermore be noted that, using the process according to the invention and the associated apparatus, it is also possible to treat and remove the coating from non-planar (e.g. bent or pre-shaped) coated substrates (for example for inclusion in glass or plastic panes provided in front, rear or side windows of vehicles), if the device for guiding the plasma heads (and possibly the abovementioned shield) has the required adjustability not only in one plane but also in space. Maintaining the normal distance between plasma head and substrate or coating is of course particularly critical on bent substrates.

Since the principle of plasma coating removal is known per se, there is no need to provide further details regarding the plasma or the generation thereof. In brief, according to the invention, the process is usually carried out under atmospheric pressure, as already mentioned. The plasma is generated by supplying power to form a gas beam which, prior to hitting the substrate or the coating, is activated by supplying electromagnetic energy (e.g. DC current, radiofrequency or microwaves), in order to influence its reactivity, its energy, its temperature and its ionization.

Depending on the type of layer that is to be removed, a suitably reactive plasma will be selected, with it being possible to treat all layers of the types mentioned in the introduction. It is also conceivable to use the plasma independently of the coating removal operation per se to activate (or roughen) the substrate surface in order for example to further improve the adhesion of adhesives that are to be subsequently applied.

Further details, features and advantages of the process according to the invention and of the apparatus according to the invention emerge from the following description of a non-limiting example of embodiment of an apparatus, with reference to the drawings.

Figure 2:
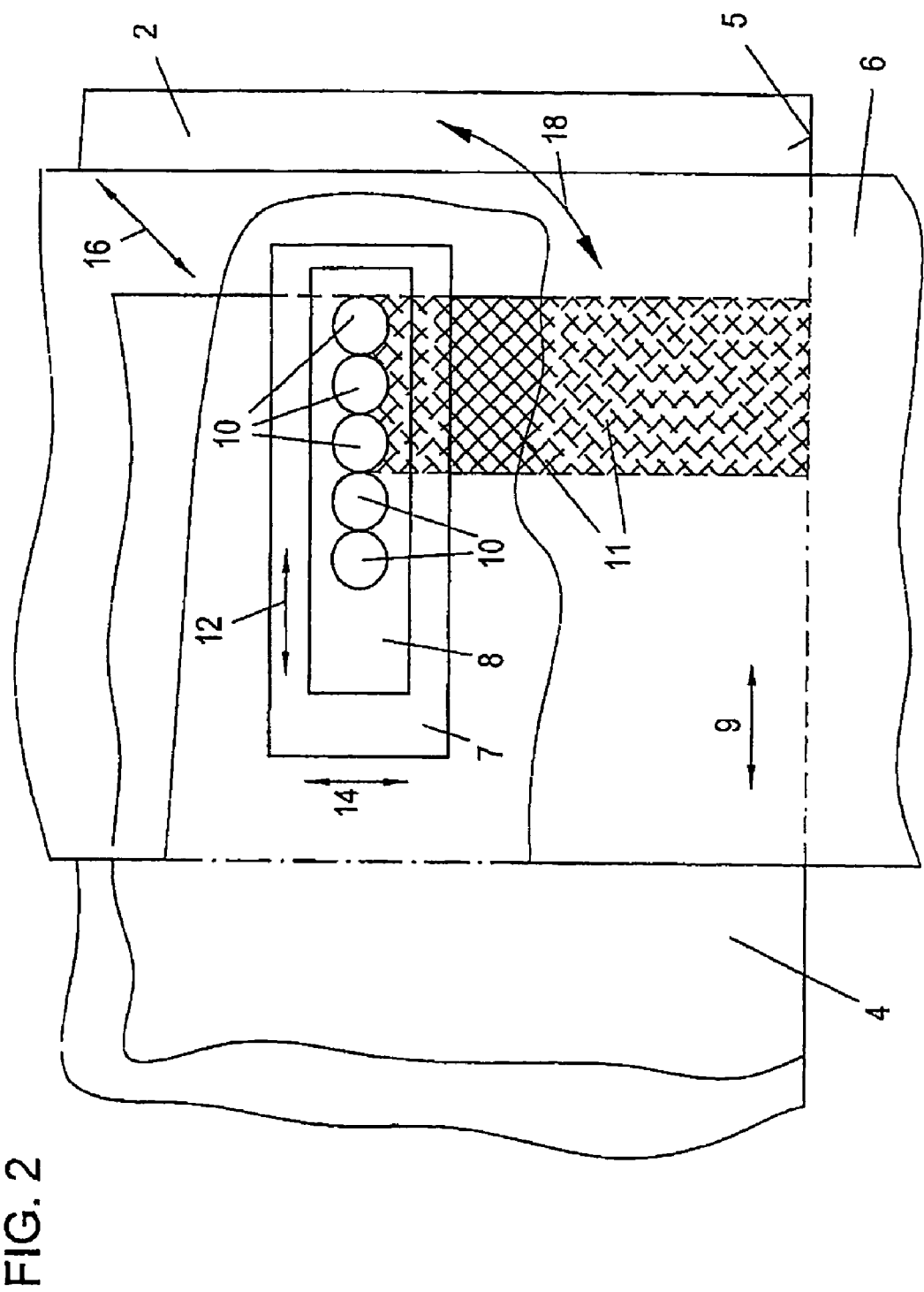
Figure 3:
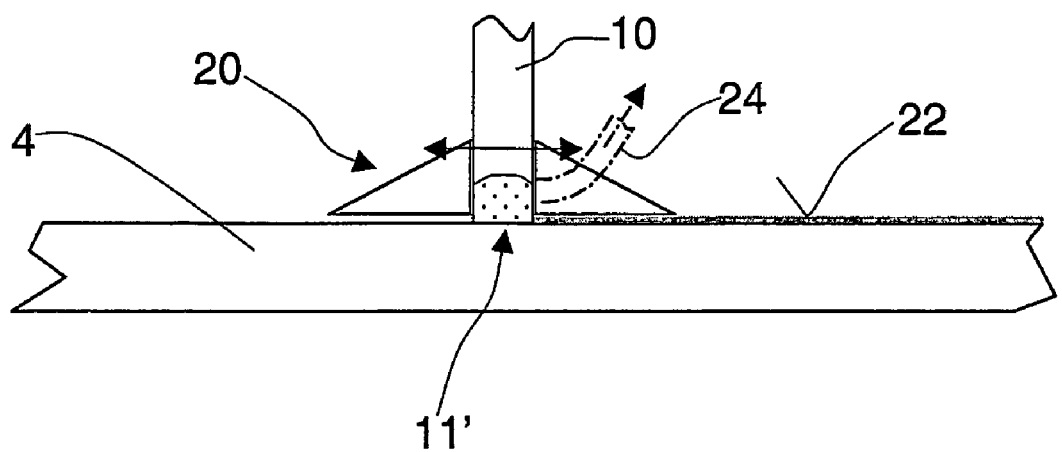

In the drawings:

FIG. 1 shows, schematically and in an oblique view, an apparatus for carrying out the process according to the invention, FIG. 2 shows, on an enlarged scale, a detail of the apparatus from FIG. 1, and FIG. 3 shows a detail of a shield and suction device combined with the plasma treatment apparatus.

An apparatus shown in FIG. 1 consists of a base frame 1 in which a supporting wall 2 is fixed. The supporting wall 2 may, as shown, be designed as an air cushion wall and for this purpose has a number of openings 3 which are acted upon by compressed air so that an air cushion is formed between the supporting wall 2, which is covered with felt for example, and a glass plate 4 leaning against said wall.

The design and orientation of the supporting wall 2 is not important per se. Supporting walls with cylinders or rollers or any other sliding surfaces are also conceivable. Of course, unlike in the diagram, the supporting wall may also be flat or inclined slightly with respect to the horizontal as a treatment plane for the substrates.

In order to transport the glass plate 4, a conveying device 5 of any type, such as conveying belts or conveying rollers, is provided at the lower edge of the supporting wall 2. Additional conveying aids which assist precise positioning (double arrow 9, FIG. 2) of the glass plate 4 may likewise be provided. In the case of a treatment plane which is horizontal or inclined slightly with respect to the horizontal, suitable positioning means are correspondingly provided.

In front of the supporting surface 2, which is inclined slightly (3 to 5°) backwards from the vertical, there is a bar 6 which is fixedly connected to the base frame 1. A support plate 7 (carriage) can move along the bar 6 (arrow 14) on a guide (not shown) arranged on the bar 6 by means of a (linear) drive (not shown).

The support plate 7 has a carrier 8 on which five plasma heads 10 are mounted next to one another in a row in the example of embodiment shown (FIG. 2). The carrier 8 for the plasma heads 10 can be pivoted on the support plate 7 about an axis (double arrow 18 in FIG. 2) perpendicular to the glass plate 4. It is thus possible to align the row of plasma heads 10 always perpendicular to the edge of a glass plate 4 from which the coating is to be removed in the edge region 11, even if the plasma heads 10 are moved along the entire periphery of the glass plate 4, and thus in principle to ensure a uniform treatment width. Unlike in the diagram, it is of course also possible to provide a number of rows of plasma heads which may possibly be offset from one another.

In addition, the carrier 8 with the plasma heads 10 may be mounted on the support plate 7 such that it can be adjusted in the longitudinal direction thereof (arrow 12), that is to say in the direction of the row of plasma heads 10. The purpose of this is to arrange in the region of the glass plate 4 or in the vertical projection onto the substrate over a coverage area in each case as many plasma heads 10 as corresponds to the desired coating removal width. Plasma heads which project beyond the edge of the substrate may optionally be switched off or even (partially) activated in order to act upon the end face of the substrate with plasma.

It is thereby also possible to orient the carrier 8 with the plasma heads 10 such that one plasma head 10—the one assigned to the edge of the glass plate 4—is oriented such that it acts on the glass plate only with part of its effective width for coating removal purposes. In this way, it is possible to remove the coating from a region having a width which is not equal to an integer multiple of the effective width of the plasma heads 10 used.

In the drawings of the example, round plasma heads are shown for the sake of simplicity, said round plasma heads being arranged in a row. However, it is also within the scope of the present invention for the cross sections of the plasma heads or nozzles to be designed otherwise, e.g. in the shape of a slit, wherein the effective width of the respective slit may also be variable. Such a change in the opening may be produced for example by movable screens which can be positioned by external force (electrically, pneumatically, etc.) and/or once again by the individual use of individual nozzles or plasma sources which may be arranged offset from one another.

It can readily be seen from FIG. 2, and therefore does not need to be shown specifically, that, unlike in the drawing, instead of the row of (round) plasma heads 10, it would also be possible to use one or more slit nozzles which individually could cover the entire row or width covered by the heads 10 or in each case only a part thereof (with it being possible for a number of slit nozzles to overlap slightly in the direction of advance). Changes to the width of the coating removal region 11 may then obviously also be brought about by changing the angle of incidence of the slit nozzle(s) relative to the direction of advance (this is of course also possible using the heads 10 by changing the angle of incidence of the row formed by them in an analogous manner). Another possibility consists in changing the mutual offset of the slit nozzles if a number of slit nozzles are provided. Finally, as already mentioned earlier, slit nozzles or in general plasma heads with variable cross sections could also be used.

An electronically controlled motor may be provided in order to move the support plate 7 along the bar 6 on the guides (not shown) in the direction of the arrow 14.

The support plate 7 may be adjusted by an actuating motor in a direction (arrow 16) perpendicular to the surface of the glass plate 4 and the supporting wall 2, in order to place the plasma heads 10 at the correct distance in each case from the surface of the glass plate 4, as a function also of the thickness of the glass plate 4 from which the coating is to be removed in the edge region 11.

A motor with integrated incremental sensor (not shown) is provided in order to rotate (arrow 18) the carrier 8 with the plasma heads 10 with respect to the retaining plate 7 about an axis perpendicular to the glass plate 4.

Any linear motors (e.g. electric, pneumatic) may be provided in order to displace the carrier 8 with the plasma heads 10 relative to the support plate 7.

Unlike in the diagram, on the one hand it may be possible for the support bar 6 to move back and forth along the guide. On the other hand, the guide for the plasma heads may also be fitted with two or more guides that are perpendicular to one another, in the manner of a 2D plotter. Further precisely guided degrees of freedom may possibly be required, in particular to machine substrates that are not planar, as mentioned above. However, no further details are given in this respect since such apparatuses are known per se from the prior art.

The apparatus described above operates as follows:

A glass plate 4 is aligned in the correct position with respect to the plasma heads 10 on the carrier 8, said glass plate standing with its lower edge on the conveying device 5 and being supported against the supporting surface 2 via the air cushion. Firstly, the carrier 8 with the plasma heads 10 is oriented such that the plasma heads 10 are aligned in a row perpendicular to a first, vertical edge of the glass plate 4. The number of plasma heads 10 arranged opposite the glass plate 4 must correspond to the desired width of coating removal 11 (alternatively, it is possible to set in operation only as many of the plasma heads 10 as necessary to correspond to the desired width of coating removal 11). The support plate 7 together with the carrier 8 and the plasma heads 10 is then moved upwards along the vertical edge of the glass plate 4 (arrow 14) in order to remove the coating from the first vertical edge of the glass plate 4 (region 11, FIG. 2). By rotating the carrier 8 with the plasma heads 10 through 90°, the plasma heads 10 are now oriented such that they are aligned in a row perpendicular to the top horizontal edge of the glass plate 4. The glass plate 4 is then moved along the supporting surface 2 so that the coating is removed from the top edge (alternatively, there is the possibility of keeping the glass plate stationary and moving the bar 6, on which the support plate 7 and the carrier 8 are arranged, in the horizontal direction along the supporting surface 2). Once the coating has been removed from the top edge of the glass plate 4, the carrier 8 is once again pivoted through 90° and the coating is removed from the second vertical edge of the glass plate 4, wherein the carrier 8 with the support plate 7 moves downwards. The glass plate 4 remains stationary.

Finally, the coating is removed from the lower horizontal edge of the glass plate 4 by moving the glass plate 4 relative to the carrier 8 with the plasma heads 10, which carrier 8 has once again been pivoted through 90°.

The coating removal itself takes place on the one hand by the action of heat under the effect of the (possibly multiple) plasma beam directed from the plasma heads 10 onto the glass plate 4. On the other hand, chemical coating removal mechanisms (etching) may be used, especially by using reactive gases in the plasma. Fluorine-containing gases are particularly suitable for such processes.

It can be seen that, with the apparatus according to the invention, the width of coating removal can be selected at will by selecting the number of plasma heads 10 that are used in a manner corresponding to the width 11, and/or by orienting the plasma heads 10 by moving the carrier 8 in a linear manner such that only the plasma heads 10 required in each case for the desired coating removal width are arranged opposite the glass plate 4. It is also possible to remove the coating from various edge sections 11 of different width on the same glass plate 4.

Finally, FIG. 3 shows, once again highly schematically, a shield 20 which directly adjoins the working region 11' of the plasma heads 10. The plasma heads are in this case represented only by the emerging beam which hits the coated substrate 4 or the coating 22, which in this case is shown as a grey covering (shown with a highly pronounced thickness for the sake of clarity). The relative mobility between the plasma beam and the substrate 4 is indicated by a horizontal double arrow. It can be seen that the coating 22 to the right of the beam is still intact, whereas it has been removed to the left of the beam. In the lower region of the plasma beam, directly above the surface of the substrate 4, it is shown that the particles detached there from the coating may be in undefined states of motion.

The shield 20 may surround the working region 11' in the manner of a frame. It is intended to prevent contamination of the coating or re-coating of regions or areas from which the coating has already been removed by detached particles of the coating 22. In addition, as also shown schematically here, a suction device 24 may be provided which immediately removes the detached particles, if necessary, and possibly of course also particularly reactive (e.g. fluorine-containing) working gases, and disposes of them (or in the case of working gases recycles them). This discharge device will expediently be combined with the shield 20 and guided synchronously with the latter, if both are provided in the system at the same time.

The invention claimed is:

1. A process for removing a coating from coated substrates, while preparing the substrates for subsequent uses in which a surface of the substrate that has been at least partially freed of coating is required, comprising the steps of:
    arranging a plurality of nozzles, at least one of which is slit shaped, to direct a plasma onto a region of the surface of a substrate from which a coating is to be removed;
    adjusting the at least one slit shaped nozzle from one orientation to another orientation to set the direction of elongation of the slit to a certain orientation direction on the surface of the substrate;
    directing a plasma onto the region of the surface of the substrate from which a coating is to be removed with the at least one slit shaped nozzle set such that the direction of elongation of the slit has the certain orientation direction on the surface of the substrate; and
    producing a linear relative movement in a certain direction between the nozzles, including the at least one slit shaped nozzle set such that the direction of elongation of the slit has the certain orientation direction on the surface of the substrate, and the substrate to thereby remove a coating from the substrate over a width/area determined by an angle of the certain orientation of the least one of the slit shaped nozzles relative to the certain direction of the relative movement; and
    controlling the plasma to remove the coating to a desired depth.

2. A process for removing a coating from coated substrates, while preparing the substrates for subsequent uses in which a surface of the substrate that has been at least partially freed of coating is required, comprising:
    adjusting a plurality of nozzles arranged in a row from one orientation to another orientation to set the direction of elongation of the plurality of nozzles to a certain orientation direction on the surface of the substrate;
    directing a plasma onto a region of the substrate from which a coating is to be removed using the plurality of nozzles arranged in a row and set to the certain orientation, to locally remove the coating, wherein the plasma has an effective width/area determined by number and/or shape of the nozzles;
    producing a relative movement between the plasma and the substrate, parallel to the edge of the substrate;
    pivoting the row of nozzles about an axis perpendicular to the substrate in the region of a corner of the substrate;
    producing a relative movement between the plasma and the substrate, parallel to another edge of the substrate; and
    controlling the plasma to remove the coating to a desired depth.

3. A process for removing a coating from coated substrates, while preparing the substrates for subsequent uses in which a surface of the substrate that has been at least partially freed of coating is required, comprising the steps of:
    adjusting a one slit shaped nozzle from one orientation to another orientation to set the direction of elongation of the slit to a certain orientation direction on the surface of the substrate;
    directing a plasma onto a region of the substrate from which a coating is to be removed using the slit shaped nozzle set at a certain rotational angle about an axis of rotation perpendicular to the substrate, to locally remove the coating;
    producing a relative movement between the plasma and the substrate, parallel to a first edge of the substrate, wherein a width of the removed coating in a direction perpendicular to the direction parallel to the first edge of the substrate corresponds to the width of the slit shaped nozzle in the direction perpendicular to the direction parallel to the first edge of the substrate;
    pivoting the slit shaped nozzle to another rotational angle about the axis of rotation that is perpendicular to the substrate in the region of a corner of the substrate where the first edge of the substrate joins another edge of the substrate;
    producing a relative movement between the plasma and the substrate, parallel to the another edge of the substrate, wherein a width of the removed coating in a direction perpendicular to the direction parallel to the another edge of the substrate corresponds to the width of the slit shaped nozzle in the direction perpendicular to the direction parallel to the another edge of the substrate; and
    controlling the plasma to remove the coating to a desired depth.

4. A process according to claim 2, including a step of deactivating at least one of said nozzles with respect to a direction of advance.

5. A process according to claim 1, including a step of providing a relative movement between the plasma and the substrate parallel to the edge of the substrate.

6. A process according to claim 2, wherein the plasma is also used to remove the coating from end edges or faces of the substrate, wherein the plasma beams are directed essentially in the normal direction onto the end edges or faces.

7. A process according to claim 2, wherein particles which are detached in the working region are immediately removed by a discharge device.

8. A process according to claim 2, used to remove metal, oxide, nitride or organic coatings or combinations of the layer types.

9. A process according to claim 2, used to remove hydrophobic and/or hydrophilic coatings.

* * * * *